United States Patent [19]
Buck

[11] 3,747,010

[45] July 17, 1973

[54] POWER SUPPLY FOR OSCILLATOR CIRCUIT OF CONTACTLESS PROXIMITY INDICATOR

[76] Inventor: Robert Buck, Torkelweg 47, 8990 Lindau-Enzisweiler, Germany

[22] Filed: Sept. 21, 1972

[21] Appl. No.: 290,866

Related U.S. Application Data

[63] Continuation-in-part of Ser. No. 80,016, Oct. 12, 1970, abandoned.

[52] U.S. Cl............. 331/65, 317/146, 317/148.5 R, 324/3, 324/40, 328/5, 331/117 R, 331/186, 340/258 C

[51] Int. Cl.......................... H01h 36/00, H03b 5/12

[58] Field of Search.................. 331/65, 117 R, 185, 331/186; 324/40, 41, 71 R, 71 SN, 3; 340/258 C, 266, 282; 328/5; 307/116; 317/146, 148.5 R, 148.5 B

[56] References Cited

UNITED STATES PATENTS 3,184,641 5/1965 Wojcik............................ 331/65 X 3,459,961 8/1969 Ravas................................ 328/5 X 3,549,905 12/1970 Johnson........................... 331/65 X

FOREIGN PATENTS OR APPLICATIONS 1,298,555 7/1969 Germany............................ 331/65

*Primary Examiner*—Roy Lake
*Assistant Examiner*—Siegfried H. Grimm
*Attorney*—Karl F. Ross

[57] ABSTRACT

A contactless proximity sensor includes an oscillator which generates an output damped by the presence of a metal part whose approach is to be detected. The operating voltage for the oscillator is developed across a Zener diode which is connected in series with a high-ohmic resistance across a supply source, the resistance being shunted by an electronic switch short-circuiting same under the control of a trigger amplifier upon a critical reduction in the amplitude of the oscillator output. Closure of the electronic switch does not materially affect the operation of the oscillator but actuates a current-responsive indicator, such as a relay, in its two-wire energizing circuit.

10 Claims, 1 Drawing Figure

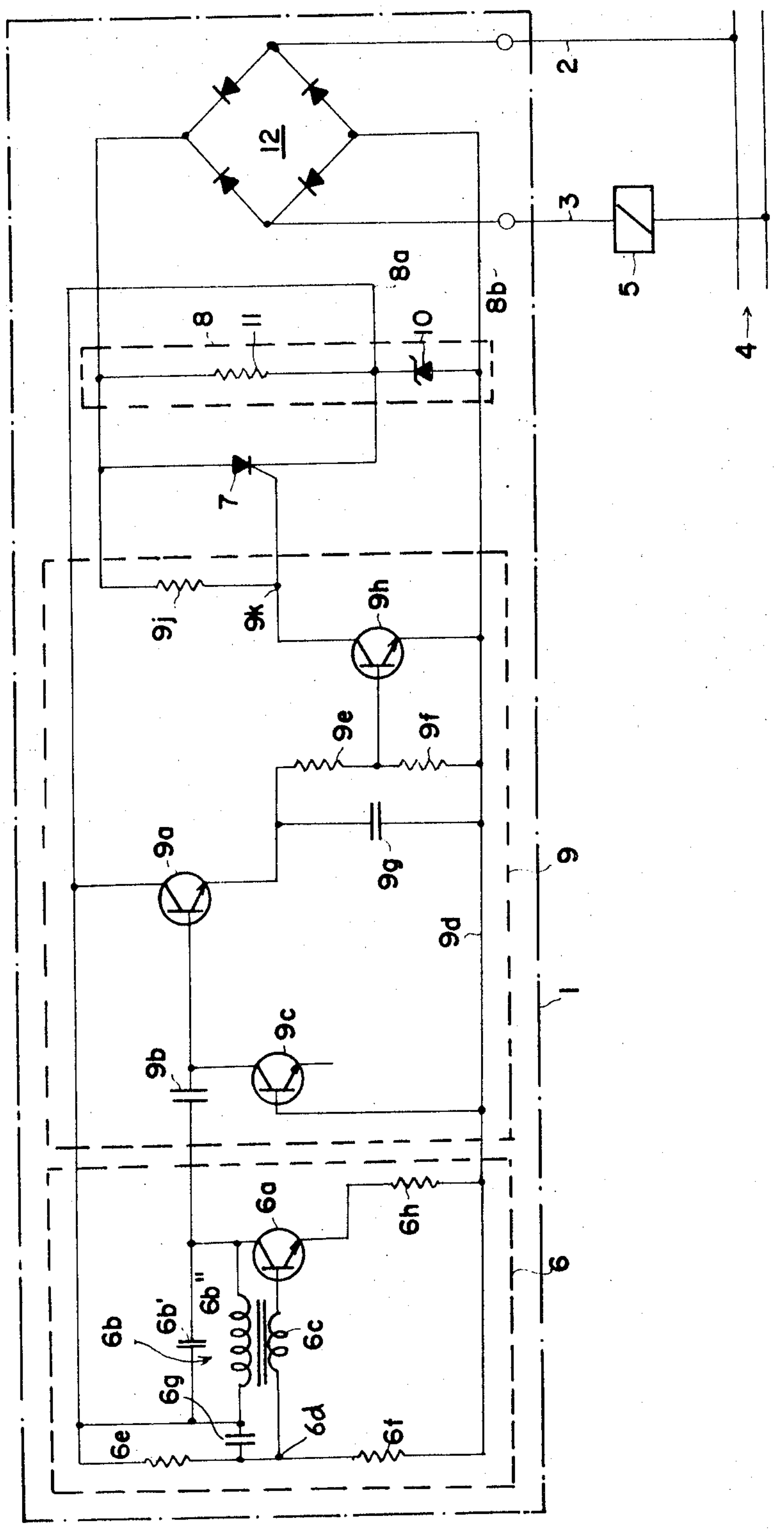

POWER SUPPLY FOR OSCILLATOR CIRCUIT OF CONTACTLESS PROXIMITY INDICATOR

This application is a continuation-in-part of my copending application Ser. No. 80,016, filed Oct. 12 1970 and now abandoned.

FIELD OF THE INVENTION

My present invention relates to electronic contactless distance indicators and, more particularly, to an electronic detector for signaling the proximity of a metallic element, e.g., in a machine tool.

BACKGROUND OF THE INVENTION Systems

Conventional distance or proximity indicators, designed to respond to the relative movement of a part carrying the indicator and an element whose approach is to be detected, generally make use of switching devices having two operating conditions (e.g., open and closed) respectively signaling the fact that such element is or is not within a predetermined range. Systems of this nature relying on physical contact with the approaching element have the disadvantage that they may suffer from material fatique, mechanical wear or environmental contamination.

There have recently been proposed various contactless arrangements which do not rely upon a physical bridging of the space between the two members. Especially where the distance of a metal part from another part is of interest, use is made of oscillators whose attenuation or damping increases as the metal part approaches. Such circuits may be coupled to switches and may even be inherently threshold-type devices. As is well known, an amplifier with positive feedback having a regenerative coupling factor K and an amplification factor V will oscillate when $KV > 1$, the product KV being known as the loop gain. However, when the damping or attenuation decreases the loop gain so that $KV < 1$, oscillation ceases. Thus, the oscillator can be set so that oscillation terminates upon the approach of the metal part to within a predetermined distance from the oscillator, the termination of oscillation being used to operate an indicator, signaling device, counter or other load.

It has been proposed, in connection with contactless switches, to connect the same by only two conductors to a stationary object when, for example, the indicator is to be mounted upon a moving part. Two-wire connections are also desirable in many instances in which the indicator is fixed. In such a case the two conductors must serve, on the one hand, to deliver the supply current for the oscillator and associate parts and, on the other hand, to carry an output signal when the metal part has reached the predetermined distance from the indicator. In conventional systems, electronic switches have been provided at the output of the oscillator which, when triggered, cut off the oscillator and render the later ineffectual. Such switches are, for example, thyristors which, upon conducting, short-circuit the supply to the oscillator. This arrangement has, of course, the disadvantage that the distance sensor is deenergized for the duration of the operation of the switch, complex circuitry is necessary to ensure reenergization of the sensor, and loading of the source is high.

OBJECTS OF THE INVENTION

It is, therefore, the principal object of the present invention to provide, in a contactless electronic proximity sensor or metal detector, means enabling the continuous energization of the oscillator independently of the state of a switch controlled thereby.

It is another object of the present invention to provide an improved electronic contactless indicator, responsive to the proximity of a metal part, which is of high sensitivity, is reliable, is inexpensive and simple, and can be connected by only two conductors to the output and input circuitry of the system.

SUMMARY OF THE INVENTION

These objects and others which will become apparent hereinafter are attained, in accordance with the present invention, in a contactless distance-responsive indicator of the general character described which comprises an oscillator responsive to the proximity of a metal part, a snap-action (i.e., bistable) amplifier or similar trigger circuit in the output of the oscillator for actuating a thyristor or other electronic switch, and a supply circuit therefor including a load to be actuated. The supply circuit comprises a series network of a Zener diode and a high-ohmic resistor bridged across the current source, the thyristor or other electronic switch being connected with its principal-electrode (anode and cathode) path across this resistor for effectively short-circuiting same upon being tripped by the trigger circuit in the oscillator output.

The Zener diode is connected between two bus bars leading to a pair of power-input terminals of the oscillator whereby the energization supply voltage for the oscillator and the trigger circuit is developed thereacross so that, in a nonconductive state of the thyristor, a bleeder current traverses the coupling network consisting of this Zener diode and high-ohmic resistor, whereas in a conductive condition of the thyristor the Zener current is intensified and causes actuation of the load. In both the conductive and the nonconductive state of the thyristor, the voltage drop across the Zener diode is sufficient to maintain the oscillator operative.

In this manner, the need for current converters, transformers and the like is avoided and separate circuitry is not required to provide a supply voltage for the oscillator. The oscillator is energized substantially independently of the load resistance and of the supply voltage whereby several such switching circuits can be connected in parallel or in series to a common current source.

BRIEF DESCRIPTION OF THE DRAWING

The above and other objects, features and advantages of the present invention will become more readily apparent from the following description, reference being made to the sole FIGURE of the accompanying Drawing which is a circuit diagram of a contactless metal detector embodying the present invention.

SPECIFIC DESCRIPTION

In the Drawing I have shown a sensing circuit 1, responsive to the proximity of a metal part (not shown), which is connected by a two-wire line 2, 3 to an alternating-current source 4 in series with a load 5 in the form of a current-responsive indicator. Member 5 may be a relay whose contacts can be switched to signal the attainment of a predetermined spacing of an external metallic element from the sensor 1.

The contactless distance sensor 1 comprises an oscillator 6 which may be of the type described in my copending applications Ser. Nos. 79,741 and 80,017, filed Oct. 12 1970, and now abandoned, and in their continuations-in-part, Ser. Nos. 290,868 and 290,867, filed concurrently with the present application. In the illustrated embodiment, the oscillator 6 comprises an NPN transistor 6*a* whose collector circuit includes a parallel-resonant network 6*b* consisting of a capacitor 6*b'* and an inductor 6*b''*. A feedback inductor 6*c* is connected between the base of the transistor 6*a* and a common terminal 6*d* of a pair of resistances 6*e*, 6*f* forming a voltage-divider network; the two coils 6*b''*, 6*c* are inductively coupled as diagrammatically indicated in the drawing. Resistance 6*e* is bridged by a shunt capacitor 6*g*. A resistance 6*h* is connected between the emitter of transistor 6a and a negative bus bar 6*d* also tied to the resistance 6*f*. This oscillator generates an output of a frequency determined by the tuned or tank circuit 6*b* and a level depending, in a manner known per se, on the damping induced by the proximity of metal parts to the oscillator (specifically to its tank circuit 6*b*) which lowers the Q of circuit 6*b* and therefore reduces the effective collector resistance of transistor 6*a* along with the amplification factor V so as to attenuate the oscillator output. A Hartley-type oscillator circuit could also be used.

I also prefer to provide a snap-action or bistable amplification stage 9 triggerable by the output of the oscillator 6 when the loop gain KV of the amplifier 6*a* thereof makes the transition between values greater and less than unity. The snap-action amplifier 9 comprises a first-stage transistor 9*a* of the NPN type whose base is tied to the collector of transistor 6*a* by a d.c.-blocking coupling capacitor 6*b*. The base of transistor 9a is biased positively by a transistor 9*c* connected as a diode to the negative bus bar 9*d* of the circuit. The output of transistor 9*a*, whose amplitude decreases upon the approach of a metallic element as described above, is applied by an emitter impedance, in the form of an R/C network consisting of resistors 9*e* and 9*f* bridged by a storage capacitor 9*g*, to the base of a second-stage NPN transistor 9*h* having a collector-biasing resistor 9*j*. The output of the snap-action or avalanche-type amplifier 9 is derived at 9*k* from the collector of the transistor 9*h*. Transistor 9*h* conducts as long as a sufficiently positive charge is accumulated on capacitor 9*g*, i.e., as long as transistor 9*a* is turned on by a biasing potential on its base corresponding to a relatively high amplitude of the oscillations generated by transistor 6*a*. Upon a substantial reduction in the amplitude level, first-stage or input transistor 9*a* and second-stage or output transistor 9*h* become less conductive until the collector potential of the latter transistor, applied to the gate of a thyristor or solid-state controlled rectifier (SCR) 7, fires the thyristor and effectively short-circuits a high-ohmic resistor 11 in parallel therewith. Resistor 11 forms part of a coupling network 8, connected across the combination of transistor 9*h* and resistor 9*j*, so that this action lowers the collector voltage at 9*k* and causes an instantaneous cutoff. Thyristor 7, quenched after each half-cycle of source 4, fires as long as this condition persists, i.e., until the resumption of high-level oscillation restores (again instantaneously) the previous stage of conductivity of transistor 9*h*. In either case, network 8 delivers operating current from source 4 to the circuits 6 and 9 via a pair of conductors 8*a* and 8*b*, the latter being an extension of negative bus bar 9*d*.

The coupling network 8 comprises the series combination of a Zener diode 10 and the high-ohmic resistor 11, connected across the positive and negative terminals of a full-wave rectifier bridge 12 energized by the power line 4 via the two supply conductors 2, 3. The load 5 is energized when electronic switch 7 is rendered conductive by the amplifier 9 so that the current flow through the rectifier bridge 12 is high.

Independently of the state of the electronic switch 7, i.e., whether or not the latter is conductive, a current traverses the Zener diode 10 and a predetermined voltage drop (Zener potential) is developed thereacross. This potential difference is substantially constant and is delivered to the oscillator and the trigger circuit 9 via conductors 8*a* and 8*b*.

It will be apparent that the described system could be readily modified to open, rather than close, an electronic switch such as the thyristor 7 upon the approach of a metallic part to be detected.

I claim:

1. A contactless proximity sensor comprising:

an oscillator having a tank circuit and two power-input terminals for generating oscillations of a predetermined amplitude in an output circuit in the absence of an extraneous metallic element, said oscillations varying in amplitude with the distance of such an extraneous element from said tank circuit;

a Zener diode connected across said terminals, said Zener diode being part of a coupling network further including a high-ohmic resistor in series therewith and an electronic switch in parallel with said resistor;

trigger means coupled to said output circuit for sensing the amplitude of said oscillations, said trigger means being connected to said switch for reversing same in response to a predetermined change in said amplitude, thereby effectively short-circuiting said resistor;

a supply circuit connecting said coupling network across a source of operating current for said oscillator, the voltage drop across said Zener diode in both a normal and a reversed condition of said switch being sufficient to maintain said oscillator operative; and indicator means in said supply circuit responsive to changes in the condition of said switch to signal a predetermined minimum departure of said amplitude from its normal level representing an approach of said metallic element to within a specified distance.

2. A proximity sensor as defined in claim 1 wherein said supply circuit comprises a two-wire line connected across an alternating-current supply and a rectifier bridge between said line and said coupling network.

3. A proximity sensor as defined in claim 1 wherein said trigger means comprises a snap-action amplifier.

4. A proximity sensor as defined in claim 3 wherein said amplifier comprises an output transistor with a base, an emitter and a collector, said emitter and collector being connected across said coupling network in series with a biasing resistance.

5. A proximity sensor as defined in claim 4 wherein said switch is a normally nonconductive thyristor having an anode gate circuit connected across said biasing resistance.

6. A proximity sensor as defined in claim 5 wherein said thyristor has its gate connected to said collector.

7. A proximity sensor as defined in claim 4 wherein said amplifier further includes rectifying means for said oscillations connected to the base of said output transistor.

8. A proximity sensor as defined in claim 7 wherein said rectifying means comprises an input transistor with a rectifying base circuit and with an emitter impedance connected to the base of said output transistor.

9. A proximity sensor as defined in claim 8 wherein said emitter impedance comprises a resistance/capacitance network.

10. A proximity sensor as defined in claim 8 wherein said rectifying base circuit includes a further transistor connected as a diode.

* * * * *